(12) United States Patent
Paul et al.

(10) Patent No.: US 6,475,958 B1
(45) Date of Patent: Nov. 5, 2002

(54) HIGH-TEMPERATURE SUPERCONDUCTOR ARRANGEMENT AND A METHOD FOR ITS PRODUCTION

(75) Inventors: Willi Paul, Wettingen (CH); Makan Chen, Baden-Dättwil (CH)

(73) Assignee: ABB Research Ltd, Zurich (CH)

( * ) Notice: Subject to any disclaimer, the term of this patent is extended or adjusted under 35 U.S.C. 154(b) by 170 days.

(21) Appl. No.: 09/709,543

(22) Filed: Nov. 13, 2000

(30) Foreign Application Priority Data

Dec. 2, 1999 (DE) .......................................... 199 57 981

(51) Int. Cl.⁷ .................... H01L 39/24; H01L 39/00; H01F 6/00
(52) U.S. Cl. ..................... 505/100; 505/434; 505/330; 505/211
(58) Field of Search ................................ 505/100, 191, 505/330, 434, 881, 211; 257/192; 438/285

(56) References Cited

U.S. PATENT DOCUMENTS

| | | | |
|---|---|---|---|
| 4,994,434 A | * 2/1991 | Hung et al. | 148/276 |
| 5,379,020 A | * 1/1995 | Meier et al. | 174/125.1 |
| 5,828,291 A | * 10/1998 | Baumann et al. | 338/32 S |
| 5,991,647 A | * 11/1999 | Brockenborough et al. | 174/15.4 |
| 6,034,324 A | * 3/2000 | Dixon et al. | 174/15.4 |
| 6,177,856 B1 | * 1/2001 | Chen et al. | 338/13 |
| 2002/0000571 A1 | * 1/2002 | Chen et al. | 257/192 |

FOREIGN PATENT DOCUMENTS

| | | |
|---|---|---|
| DE | 19634424 A1 | 3/1998 |
| DE | 19856425 A1 | 7/1999 |
| EP | 0911889 A2 | 4/1999 |
| WO | WO99/33122 | 7/1999 |

OTHER PUBLICATIONS

"A New Model of Fault Current Limiter Using YBCO Thin Film", Kubota, et al., IEEE Transctions on Applied Superconductivity, vol. 9, No. 2, Jun. 1999, pp. 1365–1368.

* cited by examiner

Primary Examiner—Tom Dunn
Assistant Examiner—Colleen Cooke
(74) Attorney, Agent, or Firm—Burns, Doane, Swecker & Mathis, L.L.P.

(57) ABSTRACT

The present invention relates to a high-temperature superconductor arrangement which is protected against hot spots. A contact-making layer 4 is provided between a superconductor layer 1 and an electrical bypass 2, which contact-making layer 4 has anisotropic electrical conductivity. This ensures a low contact resistance between the superconductor 1 and the bypass 2, without the admittance being increased in the main current flow direction 3. The said anisotropy is produced by discontinuities in the contact-making layer 4, for example by said contact-making layer 4 being broken down into areas 41 which are not connected to one another.

10 Claims, 1 Drawing Sheet

HIGH-TEMPERATURE SUPERCONDUCTOR ARRANGEMENT AND A METHOD FOR ITS PRODUCTION

Figure 1:
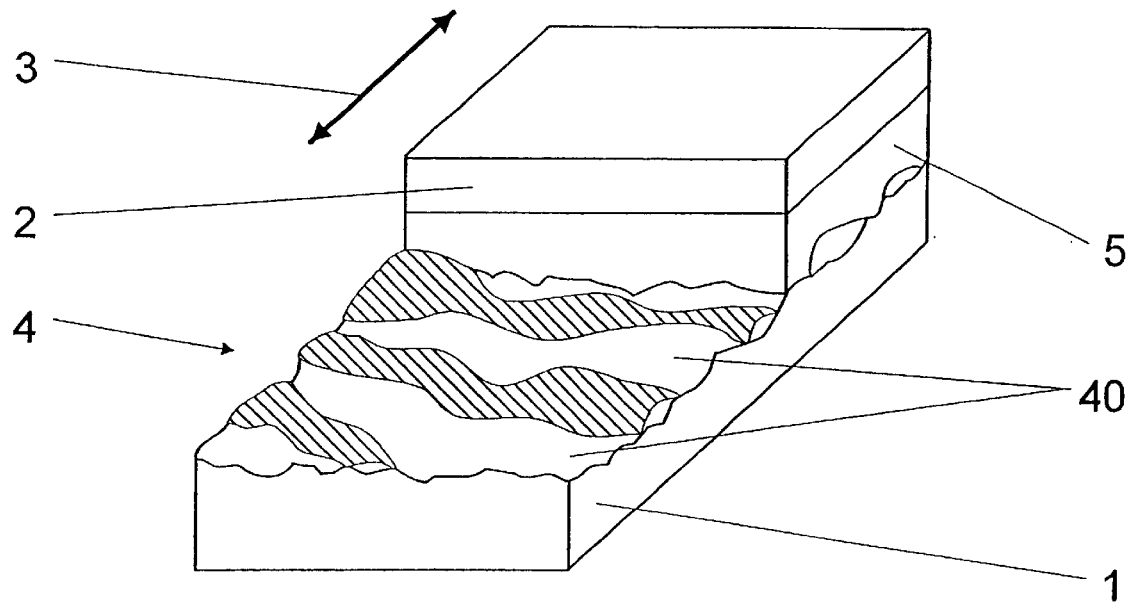

This application claims priority under 35 U.S.C. §§119 and/or 365 to Appln. No. 199 57 981.4 filed in Germany on Dec. 2. 1999; the entire content of which is hereby incorporated by reference.

The present invention relates to the field of high-temperature superconductors. It relates to a high-temperature superconductor arrangement and to a method for its production.

When high-temperature superconductors are used for high electrical power levels, the problem of so-called hot spots must be addressed. The critical current density is not constant throughout the entire superconductor, owing to unavoidable material inhomogeneities in the superconductor, or because of local thermal fluctuations. In consequence, for example as a result of a short circuit, an initial rise in the fault current will result in the current density exceeding the local critical current density at the weakest point of the superconductor first of all. A voltage drop thus starts to build up at this point in the superconductor. In the process, resistive heat is produced, which heats the superconductor in a small area, and causes the superconductivity to break down locally. A hot spot is produced which, in the end, leads to destruction of the superconductor.

First aid is offered by an electrical bypass which makes electrical contact with a high-temperature superconductor over its entire length, and is thus connected in parallel with any potential hot spot. The electrical bypass represents an alternative current path by means of which the short-circuit current can bypass the hot spot, thus homogenizing the voltage distribution.

In order to protect the superconductor against hot spots efficiently, the bypass layer must have a certain minimum conductivity. However, if the superconductor is used in a current limiter a specific minimum total bypass resistance is required in order to ensure the required limiting characteristics. The bypass resistance per unit length must therefore not be too small, in order to prevent the conductor length of the current limiter from increasing excessively. The bypass must therefore not conduct too well, or must have an appropriately small cross section.

EP 0 911 889 A2 is based on the object of preventing hot spots in current limiters for electrical power levels of more than 1 MW. The arrangement proposed for this purpose comprises a superconductor layer which makes contact with two normally conductive bypass layers via a main surface. The first bypass layer, which is not made of noble metal, is composed of steel and is at the same time used as a heat sink. The second bypass layer, which contains noble metal, is composed of silver or a silver alloy, onto which the steel layer is soldered. In order to avoid the total bypass resistance from being too small, the second bypass layer must be as thin as possible, or its resistivity must be increased by adding gallium or lead to the alloy.

Furthermore, DE-A 196 34 424 A1 discloses a method for producing a composite conductor composed of a high-temperature superconductor and a bypass layer. A silver foil is in this case applied to an inert powder layer and is covered by a so-called green sheet, which contains an oxide-ceramic powder as the base material for the high-temperature superconductor, and an organic binding agent. The layers are then fusion-processed, that is to say once the binding agent has been burnt out, the powder is partially melted. In the process, the silver is partially dissolved in the liquid high-temperature superconductor, and the thickness of the silver layer is reduced in an uncontrolled manner. This results in excellent contact resistance between the silver layer and the superconductor layer, of less than 1 $\mu\Omega cm^2$ at 77 K. At least one layer composed of a fiber-composite material is also applied, to provide mechanical strength.

The object of the present invention, in a high-temperature superconductor arrangement of the type mentioned initially, is to improve the contact between the electrical bypass and the superconductor without in the process significantly increasing the conductivity of the arrangement. This object is achieved by a high-temperature superconductor arrangement having the features of patent claim 1, and by a method for its production having the features of patent claim 8.

The essence of the invention is to couple the electrical bypass to the superconductor via a contact-making layer which is distinguished by anisotropic conductivity which is particularly pronounced in a direction at right angles to the main current flow direction, or at right angles to the conductors in the arrangement. This allows the current to commutate from the superconductor into the bypass, without the total resistance of the bypass and contact-making layer being reduced.

According to a first preferred embodiment, the anisotropy of the conductivity is achieved by the contact-making layer not being continuous, that is to say it is interrupted by discontinuities running transversely with respect to the main current flow direction and is broken down, for example, into a number of strips.

According to a further embodiment, the contact making layer is a more or less uniform distribution of individual islands which are not connected to one another.

The said two embodiments have the advantage that the thickness of the contact-making layer does not influence its conductivity in the main current flow direction, and it can thus be composed of a very good and isotropic conductor. In consequence, it is possible to choose silver or gold as materials for the contact-making layer, which materials can form a low-resistance contact with the superconductor in a sintering or heat-treatment process, without adversely affecting its characteristics.

In a third embodiment, a further, continuous intermediate layer is provided between the contact-making layer and the electrical bypass.

The advantages of the method according to the invention are that the preparation of the contact-making layer is separated from the process of applying the electrical bypass. The co-sintering or post-sintering processes which are suitable for achieving a good contact resistance between the superconductor and the contact-making layer are carried out in advance and do not adversely affect the electrical characteristics of the bypass.

Further advantageous embodiments are evident from the dependent patent claims.

Figure 2:
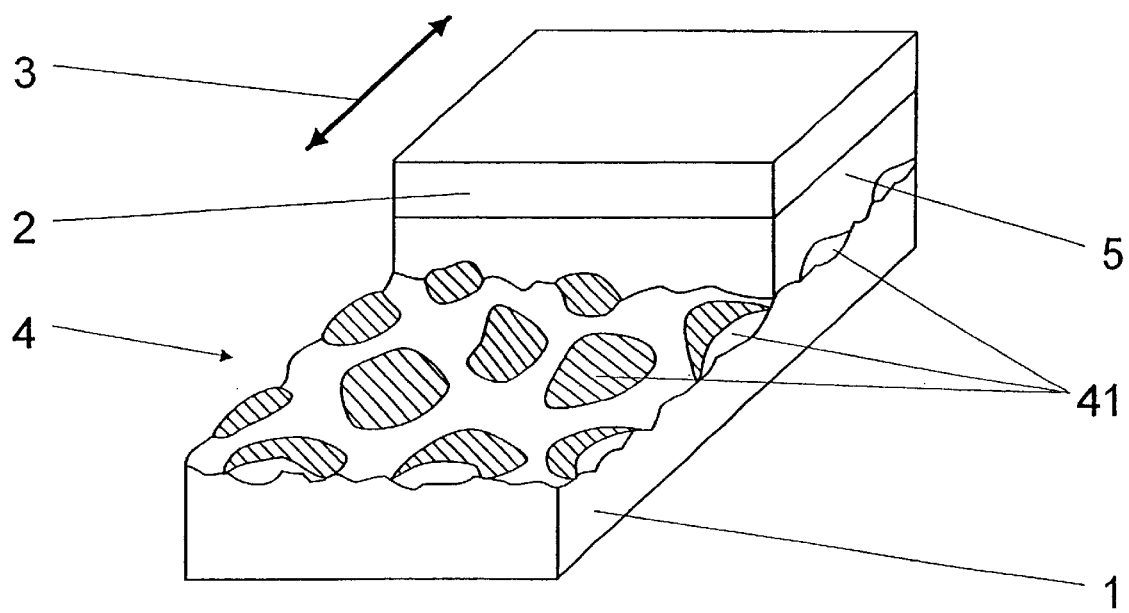

The invention will be explained in more detail in the following text with reference to exemplary embodiments and in conjunction with the drawings, in which, using illustrations which are not to scale:

FIG. 1 shows a detail from a high-temperature superconductor arrangement according to a first embodiment of the invention, and FIG. 2 shows a detail from a high-temperature superconductor arrangement according to a second embodiment of the invention.

In both drawings, the rear half of the illustration shows the complete arrangement, while the front part corresponds to the state after the first process step according to the invention.

The reference symbols used in the drawings are summarized in the List of Reference Symbols. In principle, identical parts are provided with the same reference symbols.

A planar geometry was chosen for the high-temperature superconductor arrangement shown in the drawings and for the description which now follows and relates to this arrangement, as is used, for example, for superconducting current limiters of the type mentioned initially. An analogous layer sequence is also used in the radial direction in superconducting hollow cylinders. However, the invention is in no way limited to the said geometries and can just as well be used for wires or filaments having a superconducting core which is surrounded by an electrical bypass.

In the same way, an arrangement according to the invention is not limited to use in current limiters, but may also be used in transformers or cables.

The section illustrated in FIG. 1 through a high-temperature superconductor arrangement according to the invention shows a superconducting layer 1, an electrical bypass 2 which makes electrical contact with the superconducting layer 1, and a main current flow direction 3, in which the current flows through the composite conductor comprising the superconductor 1 and the bypass 2. A contact-making layer 4 is provided between the superconductor and the bypass, which contact-making layer 4 ensures the electrical contact to the ceramic high-temperature superconductor layer 1 and is distinguished by anisotropic conductivity. A further intermediate layer 5 may be located between the contact-making layer 4 and the bypass 2, and is used for mechanical fixing of, and making electrical contact with, the bypass.

The contact-making layer 4 ensures a low contact resistance between the superconductor 1 and its electrical bypass 2. This ensures that the current commutates without any problems into the bypass layer as soon as the superconductor starts to heat up and to form a resistance locally. Thanks to the current path through the bypass in parallel with the potential hot spot, the energy dissipation in the superconductor is reduced in good time. According to the invention, the contact-making layer 4 has anisotropic conductivity so that it does not at the same time itself form a bypass, which could possibly compete with the actual bypass 2 and increase the overall conductivity in an uncontrolled manner. The conductivity of the contact-making layer 4 is greatly reduced in the main current flow direction 3 in comparison to a direction at right angles to the conductor planes in FIG. 1.

The anisotropy of the conductivity of the contact-making layer 4 may be an intrinsic characteristic of the material used, for example in the case of graphite. The required high resistance in the main current flow direction 3 may also be achieved by the topological configuration of the contact-making layer 4. This is most easily achieved by the contact-making layer 4 not forming a continuous layer, that is to say not covering the superconductor 1 completely. The contact-making layer 4 is interrupted at more or less regular intervals by discontinuities 40, which run approximately at right angles to the main current flow direction 3. In FIG. 2, the discontinuities are themselves connected to one another, so that the contact-making layer 4 is broken down into individual areas or islands 41, which are not connected to one another.

The intermediate layer 5 is used for fixing the bypass 2 and for compensating for any irregularities in the surfaces of the superconductor and bypass layer with which contact is to be made. This second layer 5 comprises a low melting-point solder or a conductive plastic, for example an epoxy resin enriched with conductive particles. It must be remembered that the required quality of the contact resistance between the superconductor ceramic and the bypass is preferably made possible by processes in which the material of the contact-making layer 4 is partially dissolved in the superconductor 1, or is diffused into it or grows into it. During such treatment, only noble metals such as silver, gold or their alloys do not lead to degradation of the superconductor 1. Direct application of the bypass 2 by means of an intermediate layer 5 without a contact-making layer 4 is not sufficient for a good contact, owing to the nature of the surface of the ceramic superconductor 1.

In the same way as the fundamental problem of hot spots, the proposed solution is not limited to a specific high-temperature superconductor type and/or to a specific method for producing it. In current limiter applications using fusion-processed $Bi_2Sr_2CaCu_2O_8$, layer thicknesses of preferably between 50 and 1000 $\mu$m for the superconductor, 10–100 $\mu$m for the intermediate layer 5 and 1–20 $\mu$m for the contact-making layer 4 are feasible for the arrangement according to the invention. The discontinuities 40, which separate individual areas of the contact-making layer 4, typically have linear extents of 10–50 $\mu$m. The islands 41 preferably have an extent of less than 1000 $\mu$m, and the distance between them is in the same order of magnitude. Assuming circular, hexagonally arranged islands 41, the percolation limit occurs at a coverage level of 90%, which should thus not be exceeded. Metallic alloys based on steel or nickel and having resistivity of more than 10 $\mu\Omega$cm at room temperature are suitable for the normally conductive bypass 2. The resultant contact resistance between the superconductor 1 and the bypass 2 is less than 1 $\mu\Omega$cm$^2$.

The method according to the invention for producing the high-temperature superconductor arrangement described above is composed of at least two separate steps. Firstly, the first contact-making layer 4 is applied to the superconductor 1, and the bypass 2 is then fixed in electrical and mechanical contact with the superconductor 1, possibly by means of an intermediate layer 5. The drawings in each case show the front half of the arrangement that is being constructed, as it presents itself after the first step. The preparation of the contact-making layer 4 in order to ensure a low contact resistance is preferably carried out at high process temperatures of 800–900° C., at which a metallic bypass 2 would be oxidized. According to the invention, this first step has already been completed at the time at which the bypass 2 is fixed, and this process is carried out at comparatively low temperatures of 100–300° C. The electrical characteristics of the bypass 2 and of the superconductor 1, which were set in advance, are thus no longer influenced by the second contact-making process.

The application of the contact-making layer 4 in the first step may in principle be carried out using a co-sintering or a post-sintering method.

If the superconductor 1 is produced by means of partial fusing of a so-called green sheet, the contact-making layer 4 may be prepared at the same time as the superconductor 1. To this end, a thin silver foil, or a silver foil provided with holes, is placed on the green sheet, or a silver powder is sprayed onto it or is distributed uniformly over the green sheet by means of a screen. Once the sintering process has been carried out at approximately 900° C., a discontinuous layer, or a more or less uniform distribution of islands, remains on the surface of the superconductor 1. As an alternative to this, the silver may also be impregnated as a three-dimensionally cross-linked fabric in a green sheet with a suitable consistency. After the loss of volume of the green sheet in the sintering process, sections of the silver network appear on the surface of the ceramic, and allow low-resistance contact to be made with the superconductor.

In another co-sintering method, a silver substrate (which is not shown in the figures) on which the green sheet is located during the partial fusion process is also used for making contact. This substrate, which is normally removed after the sintering process owing to its exorbitant conductivity, must for this purpose be thinned by means of an electrochemical etching process.

The incipient contact-making layer 4 is once again applied to the ready-sintered superconductor 1, as a sheet or powder, in a so-called post-sintering process. It is likewise possible to suspend silver particles in an organic binding agent and to brush or spray this onto the superconductor, or to distribute it in a sheet pouring method. Furthermore, methods such as electrolytic deposition, plasma or flame spraying or vacuum methods (chemical vapor deposition (CVD), cathode sputtering or molecular beam deposition (cluster deposition)) are feasible for applying a fine silver layer. This is followed by heat treatment (post-annealing) at up to 850° C., which once again results in an excellent electrical contact with the superconductor 1.

In the second process step, the bypass is brought into contact with the superconductor. This may be done by mechanically pressing them together, or via a second contact-making or intermediate layer 5. Soldering or bonding methods may be used for this purpose, which require a single heating process or curing in a vacuum at 100–300° C.

In the first-mentioned method, a thin solder layer is applied to the bypass 2, which is then brought into contact with the superconductor 1. In the second method, a conductive plastic, such as epoxy resin with silver particles, is used to bond them together. The resin is sprayed on or is applied and uniformly distributed using the screen-printing method. The bypass layer can also be precoated with a tin, silver or gold layer.

List of Reference Symbols 1 superconductor
2 electrical bypass
3 main current flow direction
4 contact-making layer
40 discontinuity
41 islands
5 intermediate layer

What is claimed is:

1. A high-temperature superconductor arrangement having a high-temperature superconductor (1) and an electrical bypass (2) which makes electrical contact with the high-temperature superconductor (1), with the current flowing through the arrangement in a main current flow direction (3), characterized in that a contact-making layer (4) is provided between the superconductor (1) and the bypass (2), which contact-making layer (4) has anisotropic electrical conductivity which is reduced in the main current flow direction (3).

2. The arrangement as claimed in claim 1, characterized in that the contact-making layer (4) is discontinuous in the main current flow direction (3), and does not completely cover the superconductor (1).

3. The arrangement as claimed in claim 1, characterized in that the contact-making layer (4) comprises individual islands (41).

4. The arrangement as claimed in claim 3, characterized in that the contact-making layer (4) covers a maximum of 90% of the superconductor (1).

5. The arrangement as claimed in claim 1, characterized in that an intermediate layer (5) is arranged between the contact-making layer (4) and the bypass (2).

6. The arrangement as claimed in claim 5, characterized in that the intermediate layer (5) has a conductive plastic or a solder.

7. The arrangement as claimed in claim 1, characterized in that the contact-making layer (4) is composed of silver or a silver alloy.

8. A method for constructing a high-temperature superconductor arrangement as claimed in claim 1, characterized in that, in a first step, a contact-making layer (4) whose electrical conductivity is reduced in a main current flow direction (3) is applied to a high-temperature superconductor (1) and, in a second step, an electrical bypass (2) is brought into contact with the contact-making layer (4).

9. The method as claimed in claim 8, characterized in that the first step is a co-sintering process, or a post-sintering process.

10. The method as claimed in claim 8, characterized in that the second step comprises the electrical bypass (2) being bonded on by means of a conductive plastic, or the electrical bypass (2) being soldered on.

* * * * *